(12) United States Patent
Takeda

(10) Patent No.: US 12,002,782 B2
(45) Date of Patent: Jun. 4, 2024

(54) SEMICONDUCTOR DEVICE WITH PLATE-SHAPED CONDUCTOR

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Shun Takeda, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 164 days.

(21) Appl. No.: 17/681,546

(22) Filed: Feb. 25, 2022

(65) Prior Publication Data

US 2023/0078823 A1    Mar. 16, 2023

(30) Foreign Application Priority Data

Sep. 16, 2021    (JP) .................................. 2021-151461

(51) Int. Cl.
*H01L 23/00* (2006.01)
*H01L 25/065* (2023.01)

(52) U.S. Cl.
CPC .......... *H01L 24/40* (2013.01); *H01L 25/0655* (2013.01); *H01L 2224/40095* (2013.01); *H01L 2224/40137* (2013.01)

(58) Field of Classification Search
CPC ....................................................... H01L 24/40
USPC ........................................................... 257/666
See application file for complete search history.

(56) References Cited

U.S. PATENT DOCUMENTS

| 8,884,309 B2 * | 11/2014 | Miura .................... H01L 25/072 |
| | | 257/77 |
| 10,032,921 B2 | 7/2018 | Takahashi et al. |
| 2006/0145319 A1 * | 7/2006 | Sun .......................... H01L 24/97 |
| | | 257/E23.044 |

FOREIGN PATENT DOCUMENTS

| CN | 101242148 A | * | 8/2008 | ........... H01L 23/473 |
| JP | 2011254387 A | | 12/2011 | |
| JP | 2012120355 A | | 6/2012 | |
| JP | 2020195138 A | | 12/2020 | |

* cited by examiner

*Primary Examiner* — Ajay Arora
(74) *Attorney, Agent, or Firm* — Kim & Stewart LLP

(57) ABSTRACT

According to one embodiment, a semiconductor device include a substrate, a first conductor on an upper surface of the substrate and a second conductor on the upper surface of the substrate. The first conductor is separated from the second conductor. A first transistor is on an upper surface of the first conductor. A first end of the first transistor is electrically connected to the first conductor. A second transistor is on an upper surface of the second conductor. A first end of the second transistor is electrically connected to the second conductor. A third conductor has a first portion that is a flat plate shape. The first portion is at a height above upper surfaces of the first and second transistors. The third conductor electrically connects a second end of the first transistor to the first end of the second transistor.

23 Claims, 7 Drawing Sheets

SEMICONDUCTOR DEVICE WITH PLATE-SHAPED CONDUCTOR

CROSS-REFERENCE TO RELATED APPLICATION

This application is based upon and claims the benefit of priority from Japanese Patent Application No. 2021-151461, filed Sep. 16, 2021, the entire contents of which are incorporated herein by reference.

FIELD

Embodiments described herein relate generally to a semiconductor device.

BACKGROUND

A power module is known as a semiconductor device that realizes a high output. The power module can be configured as a single package in which a plurality of power semiconductors are integrated.

DETAILED DESCRIPTION

Figure 1:
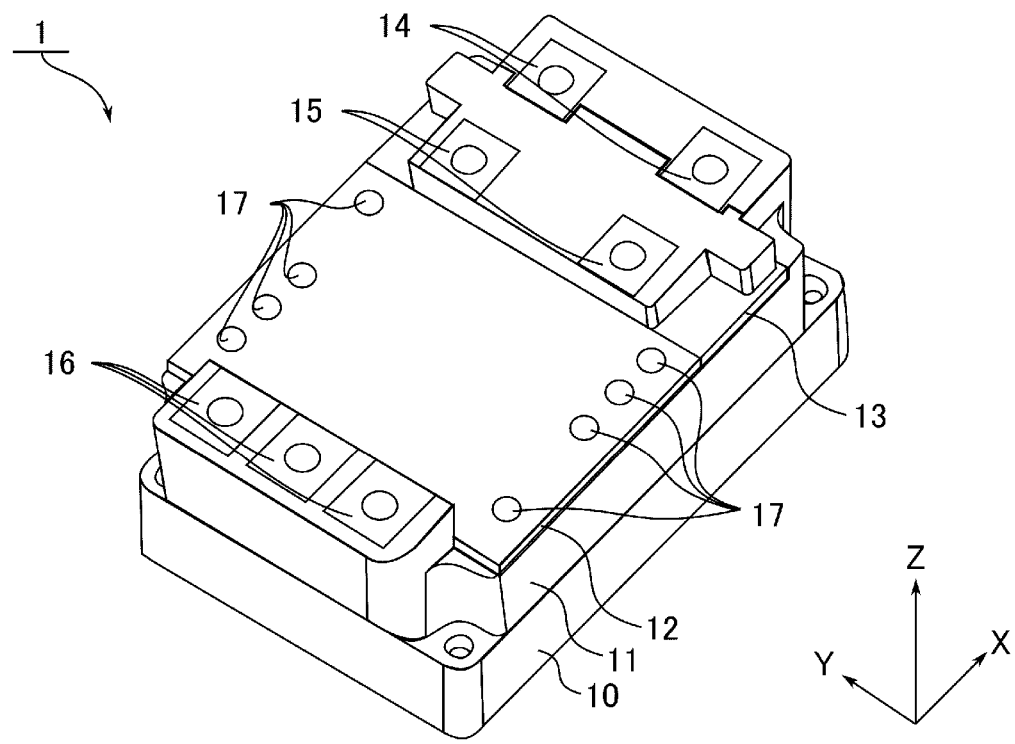
FIG. 1 is a perspective view illustrating an external structure of a semiconductor device according to a first embodiment.

Embodiments provide a semiconductor device that can be used to detect a current flowing in a circuit.

In general, according to one embodiment, a semiconductor device include a substrate, a first conductor on an upper surface of the substrate and a second conductor on the upper surface of the substrate. The first conductor is spaced from the second conductor. A first transistor is on an upper surface of the first conductor. A first end of the first transistor is electrically connected to the first conductor. A second transistor is on an upper surface of the second conductor. A first end of the second transistor is electrically connected to the second conductor. A third conductor has a first portion that is a flat plate shape. The first portion is at a height above upper surfaces of the first and second transistors. The third conductor electrically connects a second end of the first transistor to the first end of the second transistor.

Hereinafter, certain example embodiments will be described with reference to drawings. Dimensions and proportions of the drawings are not always the same as actual devices.

In the following description, elements having substantially the same functions and configurations are indicated by the same reference numerals. When elements having the same configuration are particularly distinguished from each other, different letters or numbers may be added to the end of the reference numerals.

1. FIRST EMBODIMENT

The semiconductor device according to the first embodiment is a power module. The semiconductor device according to the first embodiment can be applied to, for example, a power conversion device for a railroad vehicle, an industrial device for a renewable-energy power generation system, or the like.

1.1 Configuration

A configuration of the semiconductor device according to the first embodiment will be described.

1.1.1 External Structure

First, an external structure of the semiconductor device according to the first embodiment will be described.

FIG. 1 is a perspective view illustrating an example of the external structure of a semiconductor device 1 according to the first embodiment. The semiconductor device 1 includes a base substrate 10, a case 11, a lid 12, and a lid 13, which together constitute an outer container or an external structure of the semiconductor device 1. A circuit including a semiconductor element or elements is housed inside the container of the semiconductor device 1.

The base substrate 10 is a support for the semiconductor device 1. The base substrate 10 has a flat plate shape. The base substrate 10 corresponds to a lower portion of the container of the semiconductor device 1. The base substrate 10 has, for example, screw holes at four corners. The base substrate 10 can be fixed to another device outside the semiconductor device 1 via the screw holes. The base substrate 10 comprises, for example, copper (Cu) or ceramic material.

The case 11 is disposed on an upper surface of the base substrate 10. The case 11 is an insulator having a square tube shape. The case 11 corresponds to a side portion of the container of the semiconductor device 1. The case 11 is fixed to the base substrate 10. The case 11 comprises, for example, poly-phenylene sulfide (PPS).

The lids 12 and 13 are disposed on an upper surface of the case 11. The lids 12 and 13 are insulators and each has a flat plate shape. The lids 12 and 13 correspond to an upper portion of the container of the semiconductor device 1. The lids 12 and 13 are fixed to the case 11. The lids 12 and 13 comprise, for example, PPS.

When assembled together, the base substrate 10, the case 11, and the lids 12 and 13 form an enclosed space in which the circuit(s) of the semiconductor device 1 can be placed. In the following description, a plane parallel to a contact surface between the base substrate 10 and the case 11 is referred to as an XY plane. In the XY plane, a long side direction and a short side direction of the base substrate 10 are referred to as an X direction and a Y direction, respectively. A direction of the case 11 from the base substrate 10 is referred to as a Z direction or an upward direction. A view in the +X direction may be referred to as a front view. A view in the +Y direction may be referred to as a side view. A view fin the −Z direction may be referred to as a plan view.

The semiconductor device 1 further includes terminals 14, 15, 16, and 17.

Each of the terminals 14, 15, 16, and 17 is an end portion of a bus bar or the like that electrically connects the internal circuit structure of the semiconductor device 1 to an external device or the like. In an example of FIG. 1, two terminals 14, two terminals 15, three terminals 16, and eight terminals 17 are illustrated. The numbers of the terminals 14, 15, 16, and 17 are not limited to the example of FIG. 1, and may be designed to be any appropriate number.

The two terminals 14 are input terminals. The two terminals 14 have a positive (P) polarity. The two terminals 14 can be electrically connected to each other. The two terminals 14 are arranged side by side in the Y direction between the case 11 and the lid 13.

The two terminals 15 are input terminals. The two terminals 15 have a negative (N) polarity. The two terminals 15 can be electrically connected to each other. The two terminals 15 are arranged side by side in the Y direction between the lid 12 and the lid 13.

The three terminals 16 are output terminals. The three terminals 16 are also called alternating current (AC) terminals. The three terminals 16 can be electrically connected to each other. The three terminals 16 are arranged side by side in the Y direction between the case 11 and the lid 12.

The eight terminals 17 are control terminals and/or monitor terminals. The control terminals are, for example, terminals for controlling driving of the semiconductor element (s) disposed in semiconductor device 1. The monitor terminals are, for example, terminals for monitoring electrical characteristics of the circuit(s) in the semiconductor device 1. The eight terminals 17 are arranged in a manner that four terminals 17 are arranged on each of two opposite sides of the lid 12 along the X direction.

1.1.2 Circuit Structure

Figure 2:
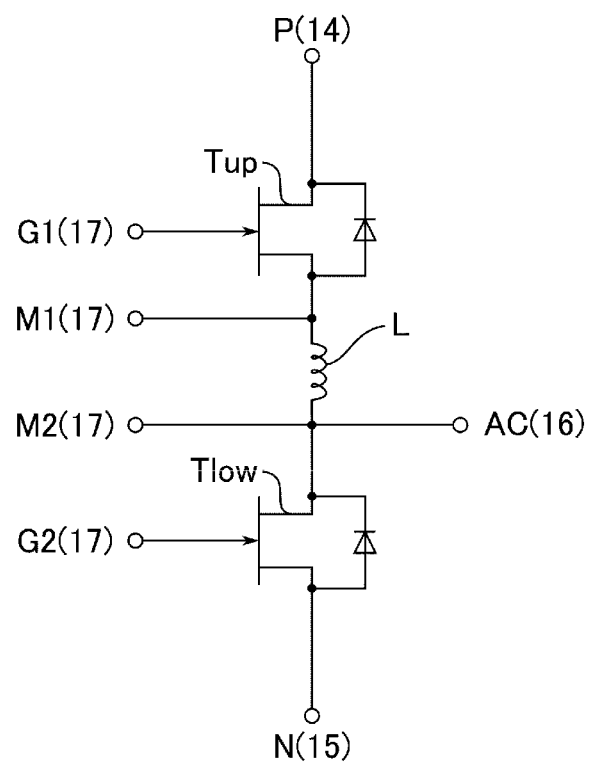
FIG. 2 is a circuit diagram of a semiconductor device according to a first embodiment.

FIG. 2 is a circuit diagram illustrating an example of a circuit of the semiconductor device 1 according to the first embodiment. In the example of FIG. 2, a case where the semiconductor device 1 includes transistors Tup and Tlow and an inductance L as electric elements is illustrated.

The transistors Tup and Tlow are metal-oxide-semiconductor (MOS) transistors. The transistors Tup and Tlow are n-type transistors. The transistors Tup and Tlow are connected in series.

The inductance L can be a parasitic inductance in the circuit structure of the semiconductor device 1. The inductance L is between the transistors Tup and Tlow in series.

The transistor Tup has a drain end connected to a node P, a source end connected to a first end of the inductance L, and a gate end connected to a node G1. The transistor Tlow has a drain end connected to a second end of the inductance L, a source end connected to a node N, and a gate end connected to a node G2. The first end of the inductance L and the source end of the transistor Tup are connected in common to a node M1. The second end of the inductance L and the drain end of the transistor Tlow are connected in common to a node AC and a node M2.

The nodes P, N, and AC correspond to the terminals 14, 15, and 16, respectively. The nodes G1 and G2 respectively correspond to two different control terminals among the terminals 17. The nodes M1 and M2 respectively correspond to two different monitor terminals among the terminals 17.

With the above configuration, a semiconductor element inside the semiconductor device 1 can be controlled by a voltage supplied from the outside of the semiconductor device 1.

The circuit structure in the semiconductor device 1 is not limited to the example of FIG. 2. For example, the transistors Tup and Tlow may be insulated-gate bipolar transistors (IGBTs). In addition, in the example of FIG. 2, just one transistor Tup and one transistor Tlow are illustrated, but the present disclosure is not limited to this. For example, each of the transistors Tup and Tlow may each comprise a plurality of transistors connected in parallel with each other.

1.1.3 Internal Structure

Figure 3:
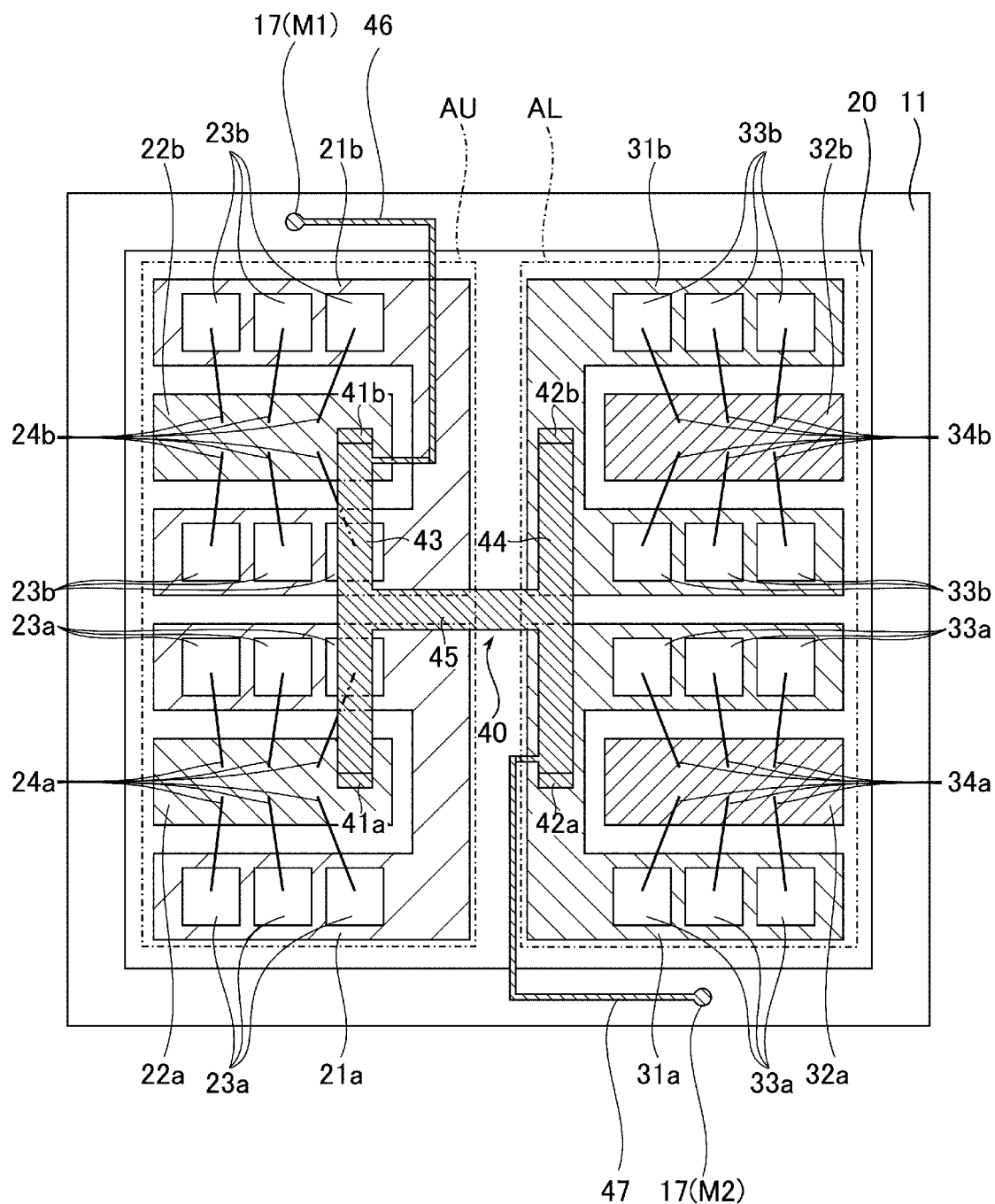
FIG. 3 is a plan view of a semiconductor device according to a first embodiment.
Figure 4:
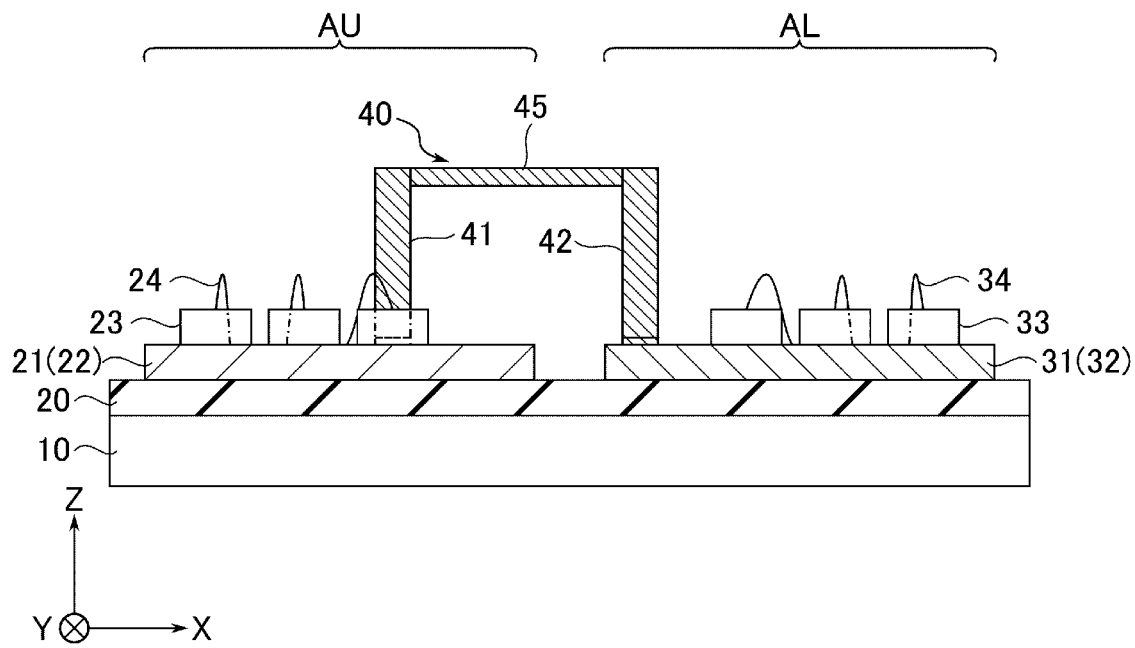
FIG. 4 is a cross-sectional view of a semiconductor device according to a first embodiment.
Figure 5:
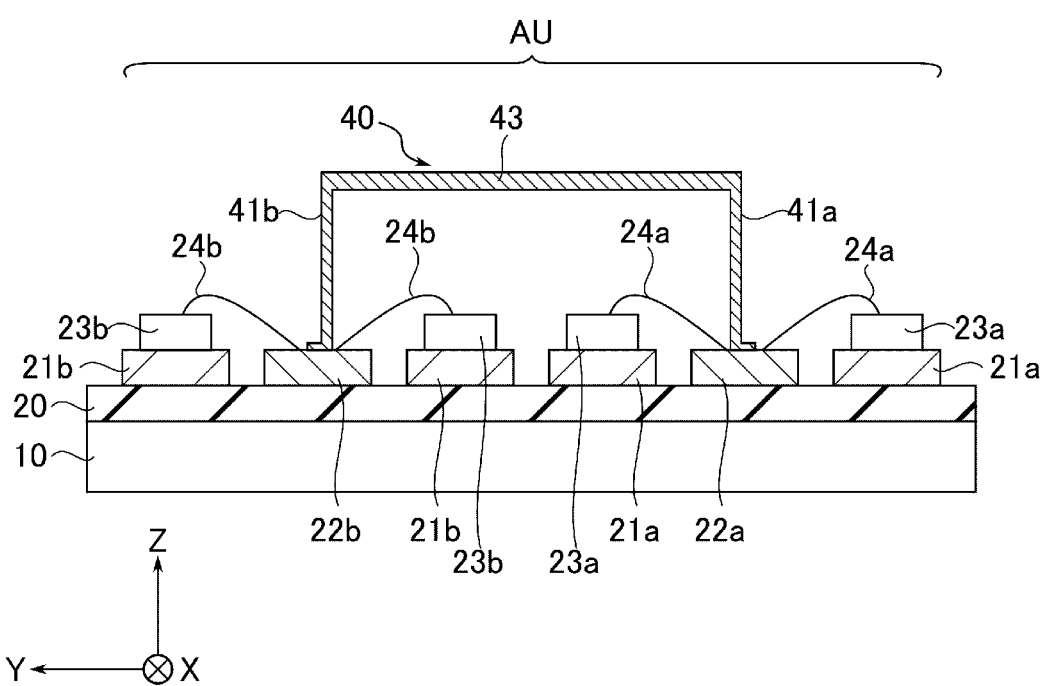
FIG. 5 is another cross-sectional view of a semiconductor device according to a first embodiment.

FIG. 3 is a plan view illustrating an example of a layout inside the semiconductor device 1 according to the first embodiment. FIG. 4 is a front view illustrating an example of a three-dimensional structure inside the semiconductor device 1 according to the first embodiment. FIG. 5 is a side view illustrating an example of the three-dimensional structure inside the semiconductor device 1 according to the first embodiment. In FIG. 3, the lids 12 and 13 and the bus bar are omitted from the depiction for purposes of descriptive clarity of other elements. In FIGS. 4 and 5, the case 11, the lids 12 and 13, and the bus bar are omitted from the depiction for purposes of descriptive clarity of other elements.

The internal structure of the semiconductor device 1 is disposed on the base substrate 10. Specifically, the semiconductor device 1 includes an insulating substrate 20, conductors 21, 22, 24, 31, 32, 34, and 40, and semiconductor elements 23 and 33 as portions of the internal structure.

In the examples of FIGS. 3 to 5, a conductor 21 corresponds to the conductors 21a and 21b. The conductor 22 corresponds to the conductors 22a and 22b. The semiconductor element 23 corresponds to the six semiconductor elements 23a and six semiconductor elements 23b. The conductor 24 corresponds to the six conductors 24a and six conductors 24b. The conductor 31 corresponds to the conductors 31a and 31b. The conductor 32 corresponds to the conductors 32a and 32b. The semiconductor element 33 corresponds to the six semiconductor elements 33a and six semiconductor elements 33b. The conductor 34 corresponds to the six conductors 34a and six conductors 34b. The conductors 21, 22, and 24, and the semiconductor element 23 collectively constitute an upper arm AU. The conductors 31, 32, and 34, and the semiconductor element 33 collectively constitute a lower arm AL. The conductor 40 electrically connects the upper arm AU and the lower arm AL.

The insulating substrate 20 is an insulating material that supports the circuit structure(s) of the semiconductor device 1. The insulating substrate 20 is disposed on the upper surface of the base substrate 10. The insulating substrate 20 comprises, for example, silicon nitride (SiN). Each configuration of the upper arm AU and the lower arm AL is disposed on an upper surface of the insulating substrate 20.

First, the configuration of the upper arm AU will be described.

The conductors 21a, 21b, 22a, and 22b are wiring patterns (wires or wire portions) of the upper arm AU. The conductors 21a, 21b, 22a, and 22b are disposed on the upper surface of the insulating substrate 20 so as to be separated (electrically distinct) from each other. The conductors 21a and 21b are connected to the terminal 14 via a bus bar or the like. The conductors 22a and 22b are connected to the conductors 31a and 31b via the conductor 40.

The semiconductor elements 23a and 23b correspond to the transistors Tup. The semiconductor elements 23a are disposed on an upper surface of the conductor 21a, and the semiconductor elements 23b are disposed on an upper surface of the conductor 21b. Each of the semiconductor elements 23a and 23b has a drain end on a lower surface thereof. Therefore, the drain ends of the semiconductor elements 23a and 23b are electrically connected to the conductors 21a and 21b, respectively. In addition, each of the semiconductor elements 23a and 23b has a source end on an upper surface thereof.

The conductors 24a and 24b can be bonding wires. Each one of the conductors 24a connects a portion of the upper surface (source end) of a corresponding semiconductor element 23a to an upper surface of the conductor 22a. Each one of the conductors 24b connects a portion of an upper surface (source end) of the corresponding semiconductor elements 23b to an upper surface of the conductor 22b. Therefore, the source ends of the semiconductor elements 23a and 23b are electrically connected to the conductors 22a and 22b, respectively.

Next, the configuration of the lower arm AL will be described.

The conductors 31a, 31b, 32a, and 32b are wiring patterns (wires or wire portions) of the lower arm AL. The conductors 31a, 31b, 32a, and 32b are disposed at positions away from the conductors 21a, 21b, 22a, and 22b on the upper surface of the insulating substrate 20 so as to be separated from each other. The conductors 31a and 31b are connected to the terminal 16 via a bus bar or the like. The conductors 32a and 32b are connected to the terminal 15 via a bus bar or the like.

The semiconductor elements 33a and 33b correspond to the transistors Tlow. The semiconductor elements 33a are disposed on an upper surface of the conductor 31a, and the semiconductor elements 33b are disposed on an upper surface of the conductor 31b. Each of the semiconductor elements 33a and 33b has a drain end on a lower surface thereof. Therefore, the drain ends of the semiconductor elements 33a and 33b are electrically connected to the conductors 31a and 31b, respectively. In addition, each of the semiconductor elements 33a and 33b has a source end on an upper surface thereof.

The conductors 34a and 34b can be bonding wires. Each one of the conductors 34a connects a portion of the upper surface (source end) of the corresponding semiconductor element 33a to an upper surface of the conductor 32a. Each one of the conductors 34b connects a portion of the upper surface (source end) of the corresponding semiconductor element 33b to an upper surface of the conductor 32b. Therefore, the source ends of the semiconductor elements 33a and 33b are electrically connected to the conductors 32a and 32b, respectively.

Next, a configuration of the conductor 40 connecting between the upper arm AU and the lower arm AL will be described.

The conductor 40 can be, for example, a conductor integrally formed as one piece. That is, the describe portions or sub-portions of conductor 40 may be parts of a single, unitary structure in some examples. In other examples, the described portions or sub-portions of conductor 40 may be joined or assembled separate pieces. The conductor 40 corresponds to the inductance L. In the examples of FIGS. 3 to 5, the conductor 40 includes legs 41 and 42, bridge portions 43, 44, and 45, and leads 46 and 47. The leg 41 includes legs 41a and 41b. The leg 42 includes legs 42a and 42b.

The legs 41a, 41b, 42a, and 42b are portions that support the bridge portions 43, 44, and 45. The legs 41a and 41b are disposed on the upper surfaces of the conductors 22a and 22b, respectively. The legs 42a and 42b are disposed on the upper surfaces of the conductors 31a and 31b, respectively. The legs 41a, 41b, 42a, and 42b extend in the Z direction. Positions of upper ends of the legs 41a, 41b, 42a, and 42b are higher than positions of upper ends of the conductors 24a, 24b, 34a, and 34b.

The bridge portions 43, 44, and 45 connect the upper arm AU to the lower arm AL. The bridge portions 43, 44, and 45 are above the upper arm AU and the lower arm AL. The bridge portion 43 has a first end connected to the upper end of the leg 41a and a second end connected to the upper end of the leg 41b. The bridge portion 43 connects the conductors 24a and 24b in parallel to the bridge portion 45. The bridge portion 44 has a first end connected to the upper end of the leg 42a and a second end connected to the upper end of the leg 42b. The bridge portion 44 connects the conductors 34a and 34b in parallel to the bridge portion 45. The bridge portion 45 has a first end connected to the bridge portion 43 and a second end connected to the bridge portion 44. The bridge portions 43, 44, and 45 have portions that extend in the XY plane. In the example of FIG. 3, the bridge portions 43 and 44 each have a flat plate shape extending lengthwise in the Y direction. The bridge portion 45 has a flat plate shape extending lengthwise in the X direction.

Compositions and shapes (widths, lengths, thicknesses, and the like) of the legs 41a, 41b, 42a, and 42b and the bridge portions 43, 44, and 45 are adjusted such that an inductance L having an intended magnitude is generated. The magnitude is set such that an induced electromotive force generated between both ends of the conductor 40 is a significant value.

The legs 41a, 41b, 42a, and 42b can have the same shape, for example. The bridge portions 43 and 44 can have the same shape, for example. The first end of the bridge portion 45 is connected to, for example, an intermediate position between the first end and the second end of the bridge portion 43. The second end of the bridge portion 45 is connected to, for example, an intermediate position between the first end and the second end of the bridge portion 44. Therefore, a difference in potential between the conductors 22a, 22b, 32a, and 32b due to the conductor 40 is reduced.

The lead 46 is a portion that connects between the terminal 17 corresponding to the node M1 and the first end of the inductance L. The lead 46 has, for example, a first end connected to the bridge portion 43 and a second end connected to the terminal 17 corresponding to the node M1.

The lead 47 is a portion that connects between the terminal 17 corresponding to the node M2 and the second end of the inductance L. The lead 47 has, for example, a first end connected to the bridge portion 44 and a second end connected to the terminal 17 corresponding to the node M2.

With the above configuration, it is possible to monitor the induced electromotive force generated between the both ends of the conductor 40 via the two terminals 17 corresponding to the nodes M1 and M2. Then, based on the induced electromotive force, it is possible to detect a current flowing between the transistor Tup and the transistor Tlow.

According to the first embodiment, it is possible to detect the current flowing in the circuit structure of the semiconductor device 1.

The conductor 40 connects the source end of the semiconductor element 23 and the drain end of the semiconductor element 33. Specifically, the legs 41 and 42 of the conductor 40 are respectively disposed on the conductors 22 and 31. The conductor 40 includes the bridge portions 43, 44, and 45 having a flat plate shape which are above the semiconductor elements 23 and 33. Therefore, the bridge portions 43, 44, and 45 can be designed in various shapes (e.g., such dimensions as the widths and the lengths may be varied) without concern about the wiring pattern formed on the insulating substrate 20 itself. Therefore, the magnitude of the inductance L generated between the ends of the conductor 40 can be adjusted (by design parameters of the bridge portions 43, 44, and 45) to be within a range that is large enough to permit the detection of the current but small enough to suppress the generation of a surge without otherwise affecting the wiring pattern on the insulating substrate 20. Therefore, a load for detecting the current flowing between the transistors Tup and Tlow can be reduced.

In addition, the conductor 40 includes the lead 46 that connects between the terminal 17 corresponding to the node M1 and the bridge portions 43, 44, and 45. The conductor 40 includes the lead 47 that connects between the terminal 17 corresponding to the node M2 and the bridge portions 43, 44, and 45. Therefore, it is possible to detect the current flowing between the transistors Tup and Tlow based on the inductance L via the two terminals 17 corresponding to the nodes M1 and M2.

The insulating substrate 20 can be fixed to the container of the semiconductor device 1. The container includes the base substrate 10, the case 11, and the lids 12 and 13. The terminals 14, 15, 16, and 17 are disposed on the outside of the container. Therefore, it is possible to monitor the current flowing between the transistors Tup and Tlow, which are circuit structures in the power module, from outside of the power module.

In addition, the bridge portions 43, 44, and 45 are located above the conductors 24 and 34. Therefore, the bridge portions 43, 44, and 45 can be designed in shapes without substantial concern with the layout of the wire bonding in the semiconductor device 1. Therefore, a design load required to set/achieve the intended inductance L can be reduced.

2. SECOND EMBODIMENT

A semiconductor device according to the second embodiment is different from the semiconductor device according to the first embodiment in that a bus bar electrically connecting the terminal 16 (corresponding to the node AC) to the circuit structure of the semiconductor device 1 is integrated with the conductor 40. Aspects different from that of the first embodiment will be mainly described. Unless otherwise noted, the configuration of the second embodiment can be considered to be the same as that of the first embodiment.

2.1 Internal Structure of Semiconductor Device

Figure 6:
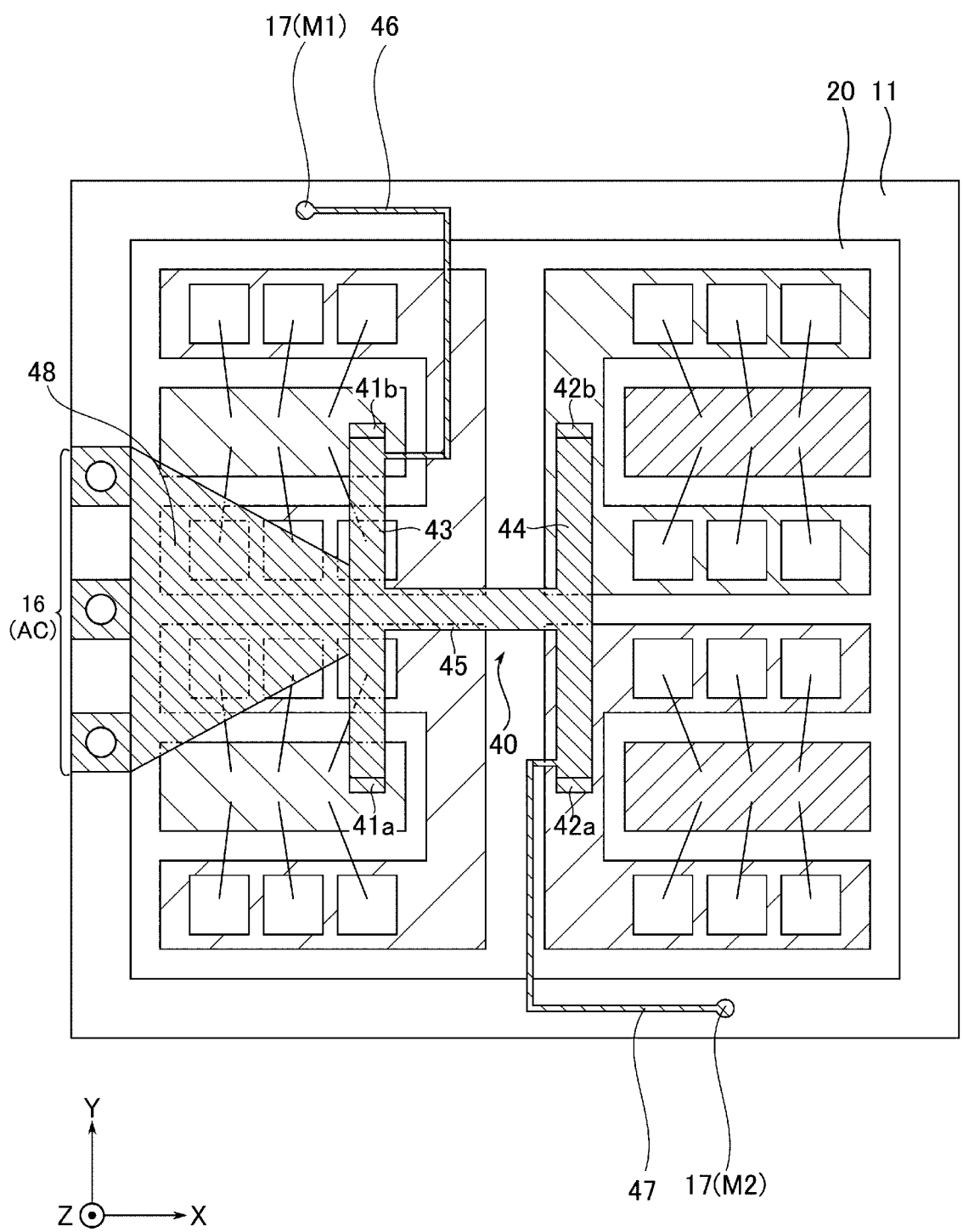
FIG. 6 is a plan view of a semiconductor device according to a second embodiment.

FIG. 6 is a plan view of a semiconductor device according to the second embodiment. FIG. 6 corresponds in general to FIG. 3 concerning the first embodiment.

The conductor 40 further includes a terminal connection portion 48. The terminal connection portion 48 is a portion that connects the terminal 16 corresponding to the node AC to the bridge portion 43. The terminal connection portion 48 can be integrally formed with, for example, the legs 41 and 42, the bridge portions 43, 44, and 45, and the leads 46 and 47.

In the example of FIG. 6, a case where the terminal connection portion 48 is connected to the bridge portion 43 is illustrated, but the present disclosure is not limited to this. For example, the terminal connection portion 48 may instead be connected to any of the legs 41 and 42 and the bridge portions 44 and 45.

According to the second embodiment, the conductor 40 is connected to the terminal 16 via the terminal connection portion 48. Therefore, it is possible to avoid have to provide another component that electrically connects an electrical path between the transistors Tup and Tlow to the terminal 16 separately from the conductor 40. Therefore, the total number of individual components of the semiconductor device 1 can be reduced.

3. THIRD EMBODIMENT

A semiconductor device according to the third embodiment is different from the semiconductor devices according to the first embodiment and the second embodiment in that the two terminals 17 corresponding to the nodes M1 and M2 are electrically connected to the circuit structure within the semiconductor device 1 by a component different from the conductor 40.

Aspects different from that of the first embodiment will be mainly described. Unless otherwise noted, the configuration of the third embodiment can be considered to be the same as that of the first embodiment.

3.1 Internal Structure of Semiconductor Device

Figure 7:
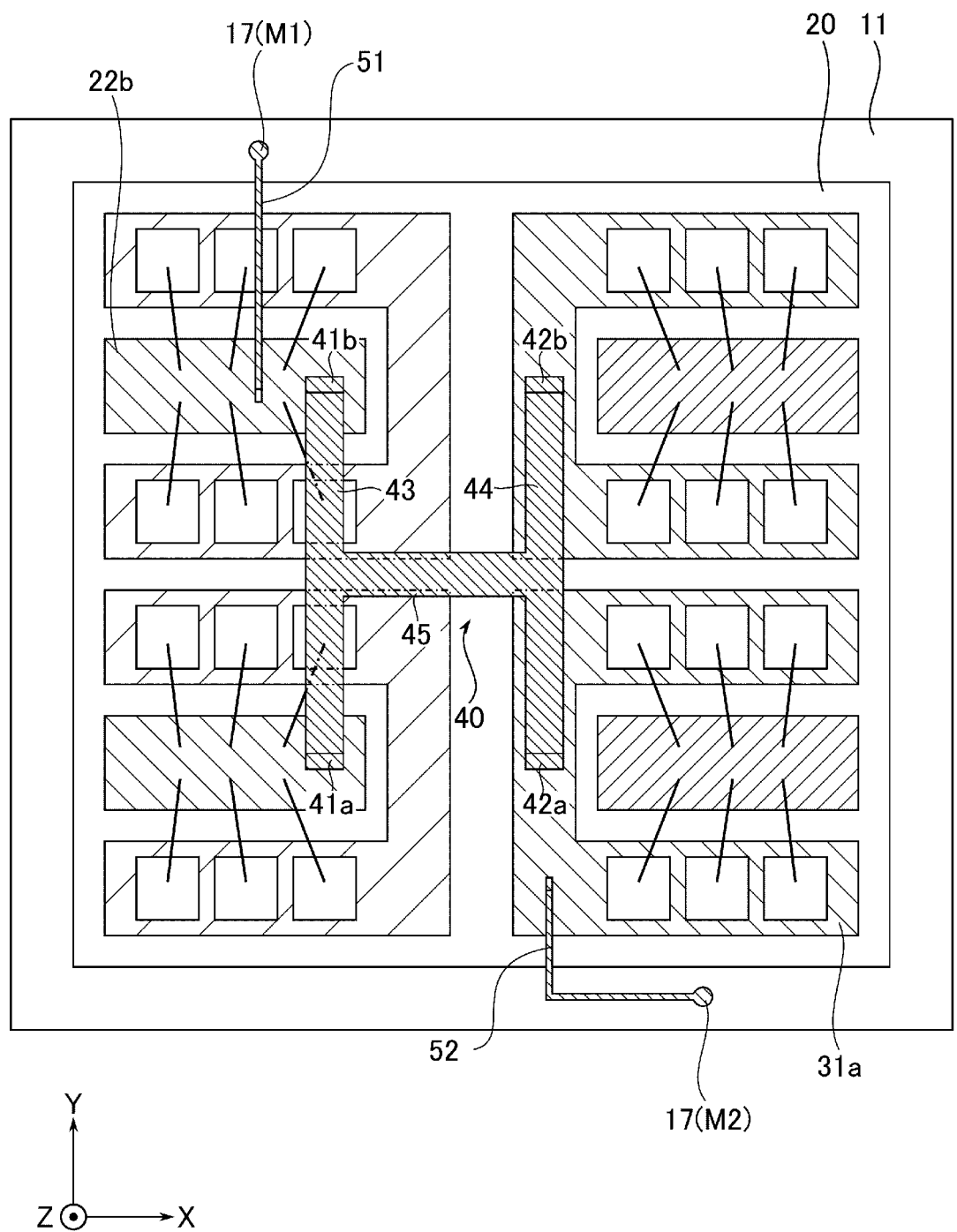
FIG. 7 is a plan view of a semiconductor device according to a third embodiment.

FIG. 7 is a plan view illustrating a semiconductor device according to the third embodiment. FIG. 7 corresponds in general to FIG. 3 concerning the first embodiment.

The conductor 40 is configured with the legs 41 and 42, and the bridge portions 43, 44, and 45.

The semiconductor device 1 further includes conductors 51 and 52.

The conductor 51 is a conductor that connects between the terminal 17 corresponding to the node M1 and the first end of the inductance L. The conductor 51 has a first end connected to an upper surface of the conductor 22b and a second end connected to the terminal 17 corresponding to the node M1.

The conductor 52 is a conductor that connects between the terminal 17 corresponding to the node M2 and the second end of the inductance L. The conductor 52 has a first end connected to the upper surface of the conductor 31a and a second end connected to the terminal 17 corresponding to the node M2.

In the example of FIG. 7, a case where the conductors 51 and 52 are respectively connected to the conductors 22b and 31a is illustrated, but the present disclosure is not limited to this. For example, the conductor 51 may be connected to the conductor 22a. The conductor 52 may be connected to the conductor 31b.

According to the third embodiment, the two terminals 17 corresponding to the nodes M1 and M2 are electrically connected between the transistors Tup and Tlow by the conductors 51 and 52 separate from the conductor 40. Therefore, a monitor position can be arbitrarily designed/selected without concern or effect on the conductor 40.

It is noted that two terminals corresponding to the nodes M1 and M2 can also function as source sense terminals. The monitor position of the source sense terminals may affect switching speeds of the transistors Tup and Tlow. According to the third embodiment, the conductors 51 and 52 provide a high degree of freedom regarding adjustment of connection positions to the conductors 22a and 22b and the conductors 31a and 31b, respectively. Therefore, the switching speeds of the transistors Tup and Tlow can be more easily adjusted or addressed.

The semiconductor device according to the third embodiment is not limited to the configuration according to the first embodiment, and a configuration according to the second embodiment may be adopted instead. In this case, the semiconductor device according to the third embodiment can exert the same effect as that of the second embodiment.

4. FOURTH EMBODIMENT

A semiconductor device according to the fourth embodiment is different from the semiconductor devices according to the first embodiment to the third embodiment in that wiring patterns connected to source ends of the semiconductor elements 23 and 33 are disposed on upper surfaces of the semiconductor elements 23 and 33.

Aspects different from that of the first embodiment will be mainly described. Unless otherwise noted, the configuration of the fourth embodiment can be considered to be the same as that of the first embodiment.

4.1 Internal Structure of Semiconductor Device

Figure 8:
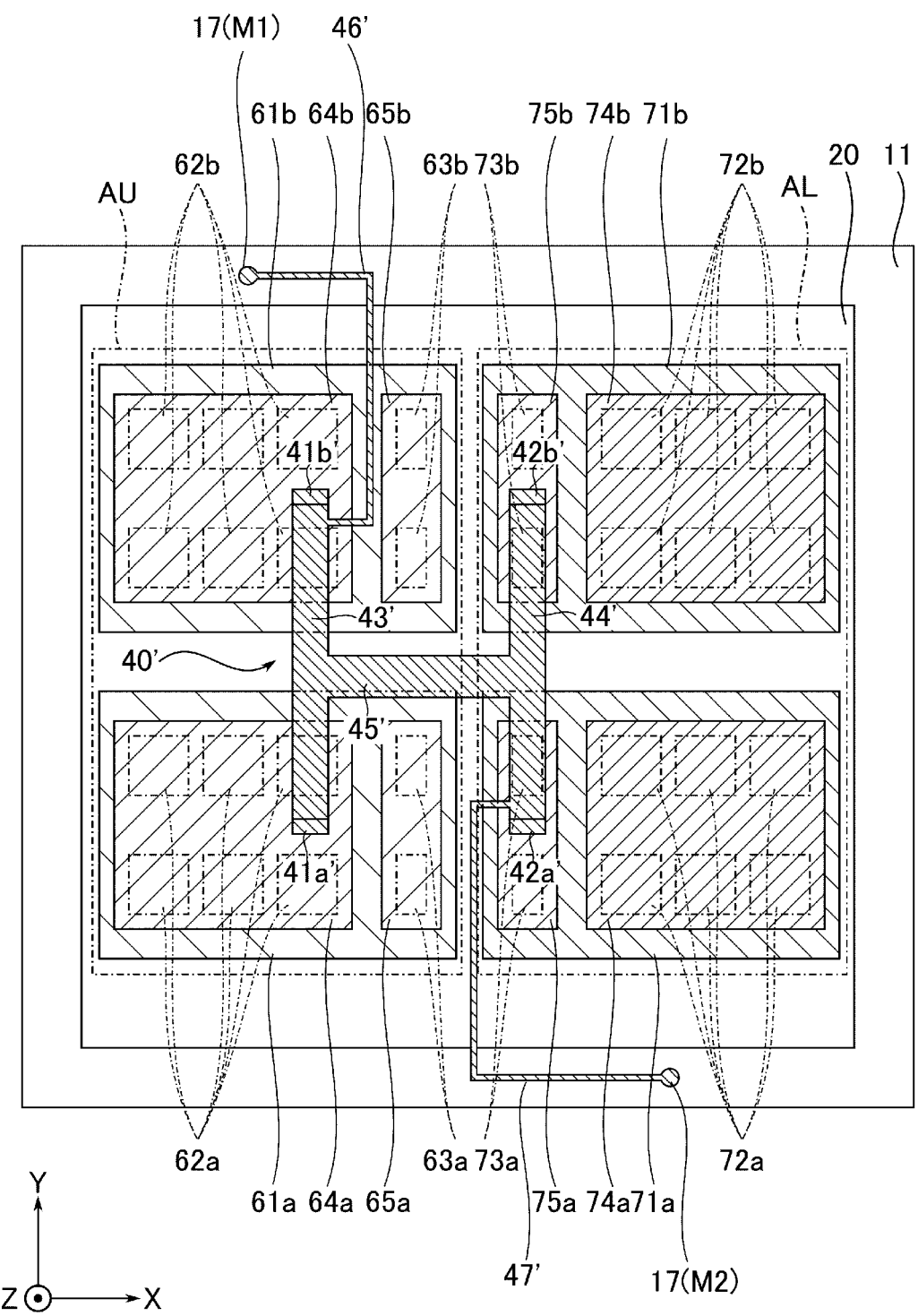
FIG. 8 is a plan view of a semiconductor device according to a fourth embodiment.
Figure 9:
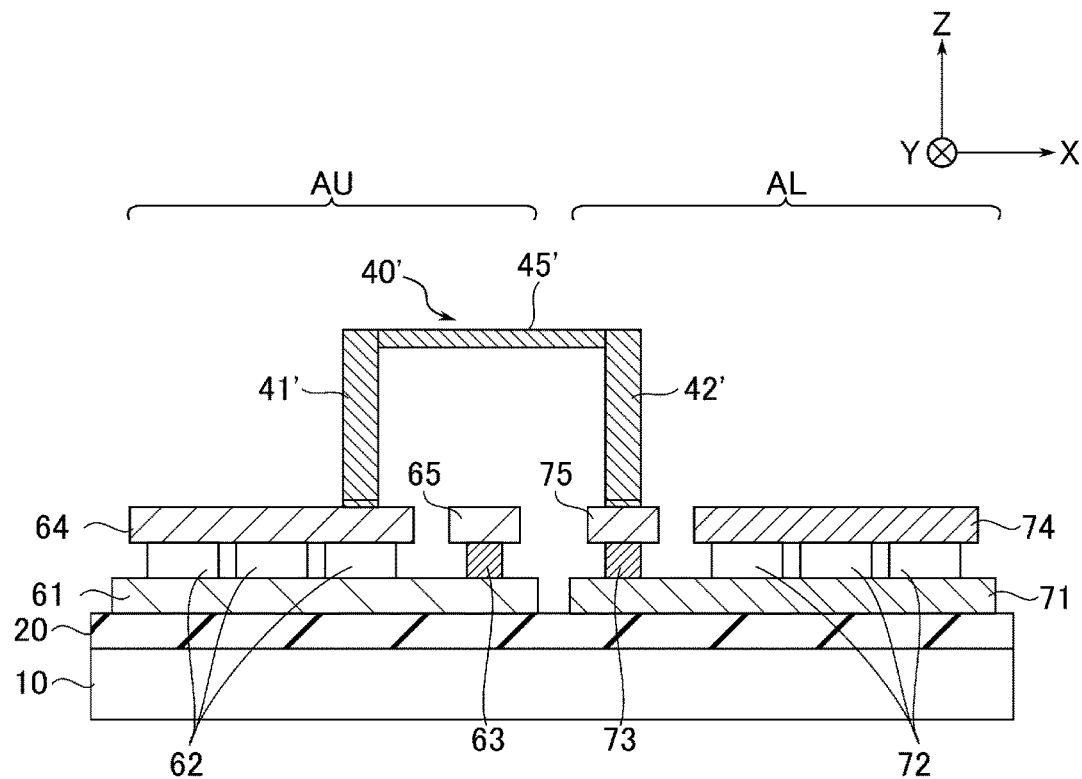
FIG. 9 is a cross-sectional view of a semiconductor device according to a fourth embodiment.
Figure 10:
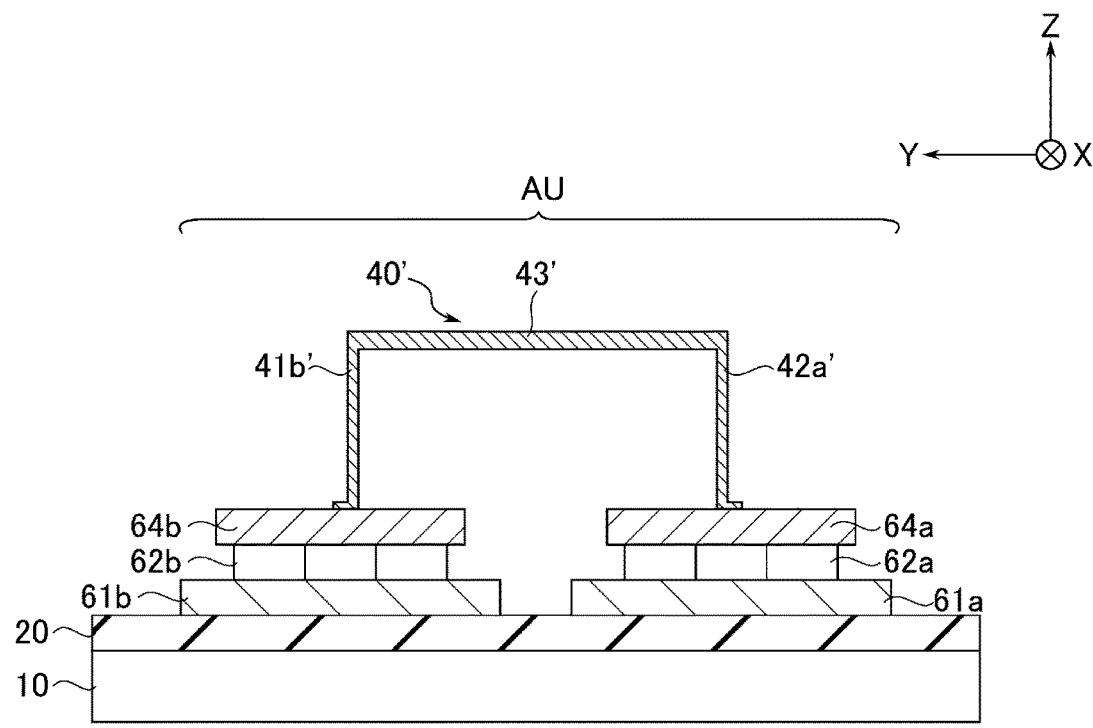
FIG. 10 is another cross-sectional view of a semiconductor device according to a fourth embodiment.

FIG. 8 is a plan view of a semiconductor device according to the fourth embodiment. FIG. 9 is a front view illustrating an example of a three-dimensional structure inside the semiconductor device according to the fourth embodiment. FIG. 10 is a side view illustrating an example of the three-dimensional structure inside the semiconductor device according to the fourth embodiment. FIGS. 8, 9, and 10 respectively correspond in general to FIGS. 3, 4, and 5 concerning the first embodiment.

The semiconductor device 1 includes, as internal structures, the insulating substrate 20, conductors 40', 61, 63, 71, and 73, semiconductor elements 62 and 72, and wiring substrates 64, 65, 74, and 75.

In the examples of FIGS. 8 to 10, the conductor 61 corresponds to the conductors 61a and 61b. The semiconductor element 62 corresponds to the six semiconductor elements 62a and six semiconductor elements 62b. The conductor 63 corresponds to the conductors 63a and 63b. The wiring substrate 64 corresponds to the wiring substrates 64a and 64b. The wiring substrate 65 corresponds to the wiring substrates 65a and 65b. The conductor 71 corresponds to the conductors 71a and 71b. The semiconductor element 72 corresponds to the six semiconductor elements 72a and six semiconductor elements 72b. The conductor 73 corresponds to the conductors 73a and 73b. The wiring substrate 74 corresponds to the wiring substrates 74a and 74b. The wiring substrate 75 corresponds to the wiring substrates 75a and 75b. The conductors 61 and 63, the semiconductor element 62, and the wiring substrates 64 and 65 collectively constitute the upper arm AU. The conductors 71 and 73, the semiconductor element 72, and the wiring substrates 74 and 75 collectively constitute the lower arm AL. The conductor 40' connects the upper arm AU and the lower arm AL.

First, a configuration of the upper arm AU will be described.

The conductors 61a and 61b are wiring patterns (wires or wire portions) below the transistor Tup. The conductors 61a and 61b are disposed on an upper surface of the insulating substrate 20 so as to be separated from each other.

The semiconductor elements 62a and 62b correspond to the transistors Tup. The semiconductor elements 62a are disposed on an upper surface of the conductor 61a, and the semiconductor elements 62b are disposed on an upper surface of the conductor 61b. Each of the semiconductor elements 62a and 62b has a drain end on a lower surface thereof. In addition, each of the semiconductor elements 62a and 62b has a source end on an upper surface thereof.

The conductors 63a and 63b can be metal spacers. The conductors 63a are disposed on the upper surface (source end) of the conductor 61a, and the conductors 63b are disposed on the upper surface (source end) of the conductor 61b. Heights of the conductors 63a and 63b are, for example, equal to heights of the semiconductor elements 62a and 62b.

The wiring substrates 64a and 64b include a wiring pattern (a conductor) above the transistor Tup. The wiring substrates 64a and 64b are disposed on the upper surface of the semiconductor element 62a and on the upper surface of the semiconductor element 62b, respectively. Therefore, the source ends of the semiconductor elements 62a and 62b are electrically connected to the wiring substrates 64a and 64b, respectively. The wiring substrates 64a and 64b are connected to the wiring substrates 75a and 75b via the conductor 40'.

The wiring substrates 65a and 65b are printed circuit board (PCB) substrates. The wiring substrates 65a and 65b include a wiring pattern (a conductor) above the transistor Tup. The wiring substrates 65a and 65b may each have a flat plate shape. The wiring substrates 65a and 65b are disposed on an upper surface of the conductor 63a and on an upper surface of the conductor 63b, respectively. Therefore, the drain ends of the semiconductor elements 62a and 62b are electrically connected to the wiring substrates 65a and 65b, respectively. The wiring substrates 65a and 65b are connected to the terminal 14 via a bus bar or the like.

Next, a configuration of the lower arm AL will be described.

The conductors 71a and 71b are wiring patterns (wires or wire portions) below the transistor Tlow. The conductors 71a and 71b are disposed at positions away from the conductors 61a and 61b on the upper surface of the insulating substrate 20 so as to be separated (electrically distinct) from each other.

The semiconductor elements 72a and 72b correspond to the transistors Tlow. The semiconductor elements 72a are disposed on an upper surface of the conductor 71a, and the semiconductor elements 72b are disposed on an upper surface of the conductor 71b. Each of the semiconductor elements 72a and 72b has a drain end on a lower surface thereof. In addition, each of the semiconductor elements 72a and 72b has a source end on an upper surface thereof.

The conductors 73a and 73b can be metal spacers. The conductors 73a and 73b are disposed on the upper surface of the conductor 71a and on the upper surface of the conductor 71b, respectively. Heights of the conductors 73a and 73b are, for example, equal to heights of the semiconductor elements 72a and 72b.

The wiring substrates 74a and 74b are PCB substrates. The wiring substrates 74a and 74b include a wiring pattern (a conductor) above the transistor Tlow. The wiring substrates 74a and 74b may each have a flat plate shape. The wiring substrates 74a and 74b are disposed on the upper surface of the semiconductor element 72a and on the upper surface of the semiconductor element 72b, respectively. Therefore, the source ends of the semiconductor elements 72a and 72b are electrically connected to the wiring substrates 74a and 74b, respectively. The wiring substrates 74a and 74b are connected to the terminal 15 via a bus bar or the like.

The wiring substrates 75a and 75b include a wiring pattern (a conductor) above the transistor Tlow. The wiring substrates 75a and 75b are disposed on an upper surface of the conductor 73a and on an upper surface of the conductor 73b, respectively. Therefore, the drain ends of the semiconductor elements 72a and 72b are electrically connected to the wiring substrates 75a and 75b, respectively. The wiring substrates 75a and 75b are connected to the terminal 16 via a bus bar or the like.

Next, a configuration of the conductor 40' connecting between the upper arm AU and the lower arm AL will be described.

The configuration of the conductor 40' is similar to the configuration of the conductor 40 in the first embodiment, excepting that the constituent members or portions are somewhat different. In the examples of FIGS. 8 to 10, the conductor 40' includes legs 41' and 42', bridge portions 43', 44', and 45', and leads 46' and 47'. The leg 41' includes legs 41a' and 41b'. The leg 42' includes legs 42a' and 42b'.

The legs 41a' and 41b' are disposed on upper surfaces of the wiring substrates 64a and 64b, respectively. The legs 42a' and 42b' are disposed on upper surfaces of the wiring substrates 75a and 75b, respectively. The legs 41a', 41b', 42a', and 42b' extend generally in the Z direction.

The configurations of the bridge portions 43', 44', and 45' and the leads 46' and 47' can be substantially the same as configurations of the bridge portions 43, 44, and 45 and the leads 46 and 47 in the first embodiment.

With the above configuration, it is possible to monitor an induced electromotive force generated between both ends of the conductor 40' via the two terminals 17 corresponding to the nodes M1 and M2, respectively. Then, based on the induced electromotive force, it is possible to detect a current flowing between the transistor Tup and the transistor Tlow.

According to the fourth embodiment, a wiring substrate 64 is disposed on an upper surface of a semiconductor element 62. A wiring substrate 75 is disposed on an upper surface of a conductor 73. The conductor 40' connects the wiring substrate 64 and the wiring substrate 75 at a position above the wiring substrates 64, 65, 74, and 75. Therefore, the legs 41' and 42' of the conductor 40' and the semiconductor elements 62 and 72 can be arranged with different heights or lengths. Therefore, a mounting area of the semiconductor elements 62 and 72 on the insulating substrate 20 can be increased. Therefore, a mounting density within the semiconductor device 1 can be improved.

The semiconductor device according to the fourth embodiment is not limited to the configuration of the first embodiment, and the configurations according to the second embodiment and/or the third embodiment may be adopted. In such cases, the semiconductor device according to the fourth embodiment can provide the same effects as those of the second embodiment and/or the third embodiment.

5. MODIFICATION

The first embodiment, the second embodiment, the third embodiment, and the fourth embodiment are not limited to the above provided examples, and various modifications may be applied.

For example, the first embodiment, the second embodiment, the third embodiment, and the fourth embodiment, a case was described in which each of the upper arm AU and the lower arm AL comprises two sets of components/portions for which the suffixes "a" and "b" are attached to of the respective reference numerals, but which are otherwise equivalent to each other is described. However, the present disclosure is not limited such a case, and, in other examples, each the upper arm AU and the lower arm AL may each comprise just one set of components/portions or may each comprise three or more sets of components/portions.

In addition, in the first embodiment, the second embodiment, the third embodiment, and the fourth embodiment described above, a case in which the upper arm AU and the lower arm AL are disposed on the upper surface of one insulating substrate 20 is described, but the present disclosure is not limited thereto. Each of the upper arm AU and the lower arm AL may be disposed on an upper surface of different or separate insulating substrates.

While certain embodiments of the present disclosure have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a substrate;
a first conductor on an upper surface of the substrate;
a second conductor on the upper surface of the substrate spaced from the first conductor;
a first transistor on an upper surface of the first conductor, a first end of the first transistor electrically connected to the first conductor;
a second transistor on an upper surface of the second conductor, a first end of the second transistor electrically connected to the second conductor; and
a third conductor having a first portion that is a flat plate shape and at a height above upper surfaces of the first and second transistors, the third conductor electrically connecting a second end of the first transistor to the first end of the second transistor, wherein
the third conductor further includes:
a second portion that electrically connects the first portion to a first terminal; and
a third portion that electrically connects the first portion to a second terminal.

2. The semiconductor device according to claim 1, further comprising:
a container enclosing the substrate, wherein
the first terminal and the second terminal are on an outer surface of the container.

3. The semiconductor device according to claim 1, further comprising:
a fourth conductor that electrically connects the second end of the first transistor to a first terminal without including the third conductor in the electrical path therebetween; and
a fifth conductor that electrically connects the first end of the second transistor to a second terminal without including the third conductor in the electrical path therebetween.

4. The semiconductor device according to claim 3, further comprising:
a container enclosing the substrate, wherein
the first terminal and the second terminal are on an outer surface of the container.

5. A semiconductor device, comprising:
a substrate;
a first conductor on an upper surface of the substrate;
a second conductor on the upper surface of the substrate spaced from the first conductor;
a first transistor on an upper surface of the first conductor, a first end of the first transistor electrically connected to the first conductor;
a second transistor on an upper surface of the second conductor, a first end of the second transistor electrically connected to the second conductor;
a third conductor having a first portion that is a flat plate shape and at a height above upper surfaces of the first and second transistors, the third conductor electrically connecting a second end of the first transistor to the first end of the second transistor; and
a fourth conductor on the upper surface of the substrate separated from the first conductor and the second conductor, the fourth conductor being electrically connected to the second end of the first transistor, wherein
the third conductor electrically connects the fourth conductor to the second conductor.

6. The semiconductor device according to claim 5, further comprising:
a fifth conductor that electrically connects the second end of the first transistor to the fourth conductor, wherein
the first portion of the third conductor is above the fifth conductor.

7. The semiconductor device according to claim 1, further comprising:
a fourth conductor above the first transistor and electrically connected to the second end of the first transistor; and
a fifth conductor above the second transistor and electrically connected to the first end of the second transistor, wherein
the third conductor electrically connects the fourth conductor and the fifth conductor.

8. A semiconductor device, comprising:
a substrate;
a first conductor on an upper surface of the substrate;
a second conductor on the upper surface of the substrate spaced from the first conductor;
a first transistor on an upper surface of the first conductor, a first end of the first transistor electrically connected to the first conductor;
a second transistor on an upper surface of the second conductor, a first end of the second transistor electrically connected to the second conductor; and
a third conductor having a first portion that is a flat plate shape and at a height above upper surfaces of the first and second transistors, the third conductor electrically connecting a second end of the first transistor to the first end of the second transistor, wherein
the third conductor has a second portion that electrically connects the first portion to an output terminal.

9. The semiconductor device according to claim 8, further comprising:
a container enclosing the substrate, wherein
the output terminal is on an outer surface of the container.

10. The semiconductor device according to claim 9, wherein the container includes a lid and the output terminal is on the lid.

11. The semiconductor device according to claim 8, wherein the third conductor is copper.

12. The semiconductor device according to claim 8, further comprising:
a fourth conductor connected to the first portion of the third conductor;
a fifth conductor connected to the first portion of the third conductor at a position spaced from the fourth conductor, wherein
the fourth and fifth conductors are electrically connected to one another via the third conductor.

13. The semiconductor device according to claim 8, further comprising:
a fourth conductor connected to the first conductor;
a fifth conductor connected to the second conductor, wherein
the fourth and fifth conductors are electrically connected to one another via the third conductor.

14. The semiconductor device according to claim 8, wherein the first transistor and the second transistor are connected in series.

15. The semiconductor device according to claim 1, wherein the first transistor and the second transistor are connected in series.

16. The semiconductor device according to claim 1, further comprising:
a container enclosing the substrate; and
an output terminal on an outer surface of the container; and
a connector portion connecting the output terminal to the first portion of the third conductor, wherein
the first terminal and the second terminal are on the outer surface of the container.

17. The semiconductor device according to claim 1, further comprising:
a fourth conductor on the upper surface of the substrate separated from the first conductor and the second conductor, the fourth conductor being electrically connected to the second end of the first transistor, wherein
the third conductor electrically connects the fourth conductor to the second conductor.

18. The semiconductor device according to claim 17, further comprising:
a fifth conductor that electrically connects the second end of the first transistor to the fourth conductor, wherein
the first portion of the third conductor is above the fifth conductor.

19. The semiconductor device according to claim 1, wherein the third conductor has a fourth portion that electrically connects the first portion to an output terminal.

20. The semiconductor device according to claim 5, wherein the third conductor has a second portion that electrically connects the first portion to an output terminal.

21. The semiconductor device according to claim 20, further comprising:
a container enclosing the substrate, wherein
the output terminal is on an outer surface of the container.

22. The semiconductor device according to claim 5, further comprising:
a fifth conductor that electrically connects the second end of the first transistor to a first terminal without including the third conductor in the electrical path therebetween; and a sixth conductor that electrically connects the first end of the second transistor to a second terminal without including the third conductor in the electrical path therebetween.

23. The semiconductor device according to claim 5, wherein the first transistor and the second transistor are connected in series.

* * * * *